(12) United States Patent
Zhang

(10) Patent No.: US 8,609,531 B1
(45) Date of Patent: Dec. 17, 2013

(54) METHODS OF SELECTIVELY FORMING RUTHENIUM LINER LAYER

(71) Applicant: Global Foundries Inc., Grand Cayman (KY)

(72) Inventor: Xunyuan Zhang, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/787,384

(22) Filed: Mar. 6, 2013

(51) Int. Cl.
*H01L 21/4763* (2006.01)

(52) U.S. Cl.
USPC .... 438/623; 438/625; 438/672; 257/E21.582; 257/E21.586

(58) Field of Classification Search
USPC ......... 438/622–623, 625, 627–629, 674–675, 438/687; 257/E21.171, E21.582, E21.586
See application file for complete search history.

(56) References Cited

U.S. PATENT DOCUMENTS

| | | | |
|---|---|---|---|
| 7,405,154 B2 | 7/2008 | Cabral, Jr. et al. | |
| 7,682,946 B2 | 3/2010 | Ma et al. | |
| 7,799,674 B2 | 9/2010 | Shinriki et al. | |
| 7,910,165 B2 | 3/2011 | Ganguli et al. | |
| 7,985,669 B2 | 7/2011 | Huotari et al. | |
| 8,089,157 B2 | 1/2012 | Cabral, Jr. et al. | |
| 2007/0054487 A1 | 3/2007 | Ma et al. | |
| 2007/0077750 A1 | 4/2007 | Ma et al. | |
| 2011/0074039 A1* | 3/2011 | Zhang et al. | 257/774 |
| 2012/0189774 A1 | 7/2012 | Haukka et al. | |

* cited by examiner

*Primary Examiner* — Thanhha Pham
(74) *Attorney, Agent, or Firm* — Williams, Morgan & Amerson, P.C.

(57) ABSTRACT

One method includes forming a metal-containing material layer in a trench/via formed in a layer of insulating material, forming a sacrificial material layer above the metal-containing material layer to over-fill the trench/via with the sacrificial material, performing at least one process operation to remove portions of the metal-containing material layer and the sacrificial material layer positioned above an upper surface of the layer of insulating material and outside of the trench/via, removing the sacrificial material from within the trench/via to expose the metal-containing material layer positioned within the trench/via, selectively forming a material layer comprising a noble metal on the exposed metal-containing material without forming the material layer on the layer of insulating material, performing an anneal process to convert the metal-containing material layer into a metal-based silicate based barrier layer and forming a conductive copper structure in at least the trench/via above the material layer comprising the noble metal.

18 Claims, 4 Drawing Sheets

METHODS OF SELECTIVELY FORMING RUTHENIUM LINER LAYER

BACKGROUND OF THE INVENTION

1. Field of the Invention

Generally, the present disclosure relates to the manufacture of sophisticated semiconductor devices, and, more specifically, to various methods of selectively forming ruthenium liner layers in connection with the formation of various conductive structures, such as conductive lines/vias.

2. Description of the Related Art

The fabrication of advanced integrated circuits, such as CPUs, storage devices, ASICs (application specific integrated circuits) and the like, requires a large number of circuit elements, such as transistors, capacitors, resistors, etc., to be formed on a given chip area according to a specified circuit layout. During the fabrication of complex integrated circuits using, for instance, MOS (Metal-Oxide-Semiconductor) technology, millions of transistors, e.g., N-channel transistors (NFETs) and/or P-channel transistors (PFETs), are formed on a substrate including a crystalline semiconductor layer. A field effect transistor, irrespective of whether an NFET transistor or a PFET transistor is considered, typically includes doped source and drain regions that are formed in a semiconducting substrate and separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

To improve the operating speed of field effect transistors (FETs), and to increase the density of FETs on an integrated circuit device, device designers have greatly reduced the physical size of FETs over the past decades. More specifically, the channel length of FETs has been significantly decreased, which has resulted in improving the switching speed of FETs and the overall functionality of the circuit. Further scaling (reduction in size) of the channel length of transistors is anticipated in the future. While this ongoing and continuing decrease in the channel length of transistor devices has improved the operating speed of the transistors and integrated circuits that are formed using such transistors, there are certain problems that arise with the ongoing shrinkage of feature sizes that may at least partially offset the advantages obtained by such feature size reduction. For example, as the channel length is decreased, the pitch between adjacent transistors likewise decreases, thereby increasing the density of transistors per unit area. This scaling also limits the size of the conductive contact elements and structures, which has the effect of increasing their electrical resistance. In general, the reduction in feature size and increased packing density makes everything more crowded on modern integrated circuit devices.

Typically, due to the large number of circuit elements and the required complex layout of modern integrated circuits, the electrical connections of the individual circuit elements cannot be established within the same level on which the circuit elements, such as transistors, are manufactured. Rather, modern integrated circuit products have multiple so-called metallization layer levels that, collectively, contain the "wiring" pattern for the product, i.e., the conductive structures that provide electrical connection to the transistors and the circuits, such as conductive vias and conductive metal lines. In general, the conductive metal lines are used to provide intra-level (same level) electrical connections, while inter-level (between levels) connections or vertical connections are referred to as vias. In short, the vertically oriented conductive via structures provide the electrical connection between the various stacked metallization layers. Accordingly, the electrical resistance of such conductive structures, e.g., lines and vias, becomes a significant issue in the overall design of an integrated circuit product, since the cross-sectional area of these elements is correspondingly decreased, which may have a significant influence on the effective electrical resistance and overall performance of the final product or circuit.

Improving the functionality and performance capability of various metallization systems has also become an important aspect of designing modern semiconductor devices. One example of such improvements is reflected in the increased use of copper metallization systems in integrated circuit devices and the use of so-called "low-k" dielectric materials (materials having a dielectric constant less than about 3) in such devices. Copper metallization systems exhibit improved electrical conductivity as compared to, for example, prior metallization systems that used tungsten for the conductive lines and vias. The use of low-k dielectric materials tends to improve the signal-to-noise ratio (S/N ratio) by reducing crosstalk as compared to other dielectric materials with higher dielectric constants. However, the use of such low-k dielectric materials can be problematic as they tend to be less resistant to metal migration as compared to some other dielectric materials.

Copper is a material that is difficult to directly etch using traditional masking and etching techniques. Thus, conductive copper structures, e.g., conductive lines or vias, in modern integrated circuit devices are typically formed using known single or dual damascene techniques. FIGS. 1A-1B depict one illustrative prior art technique for forming a conductive copper structure. In general, the damascene technique involves: (1) forming one or more trenches/vias 12 in a layer of insulating material 14; (2) depositing one or more relatively thin barrier layers 16 (e.g., TiN, TaN); (3) forming an adhesion or wetting layer 18 (e.g., tantalum, ruthenium, cobalt, etc.) on the barrier layer 16; (4) forming a copper seed layer (not shown) and bulk copper material 20 across the substrate and in the trenches/vias 12; and (5) performing a chemical mechanical polishing process to remove the excess portions of the barrier layer 16, the adhesion layer 18 and the copper material 20 positioned outside of the trenches/vias 12 to define the illustrative final conductive copper structures 22 depicted in FIG. 1B. As is well known to those skilled in the art, the copper material 20 is typically formed by performing an electrochemical copper deposition process after a thin conductive copper seed layer (not shown in FIG. 1A) is deposited by physical vapor deposition on the adhesion layer 18.

However, as everything becomes more crowded on an integrated circuit product, problems may arise when employing traditional damascene techniques. More specifically, it becomes more difficult to reliably fill very small trench/via patterns with copper. To that end, semiconductor manufacturers have started to use materials such as ruthenium and cobalt as the adhesion layer 18 to facilitate copper filling of the trench/via 12. While ruthenium improves copper filling characteristics, its use as an adhesion layer material is not without problems. In some cases, time dependent dielectric breakdown (TDDB) characteristics have tended to decrease for conductive structures that employ ruthenium adhesion layers, but the reason for such degradation remains unresolved. The insulation breakdown problem may be related to attempts to remove portions of the ruthenium adhesion layer by performing a chemical mechanical polishing (CMP) process. In general, the removal rate of ruthenium during a typical CMP process is relatively low because it is hard to oxidize ruthenium, a noble metal. Thus, such problems may lead to several undesirable situations like excessive copper dishing, surface scratches on the low-k insulating material 14 due to the non-uniform density/thickness of the ruthenium material during and after the CMP process.

The present disclosure is directed to various methods of selectively forming ruthenium liner layers in connection with the formation of various conductive structures, such as conductive lines/vias, that may solve or at least reduce some of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of selectively forming ruthenium liner layers in connection with the formation of various conductive structures, such as conductive lines/vias. One illustrative method disclosed herein includes forming a metal-containing material layer in a trench/via that was formed in a layer of insulating material, forming a sacrificial material layer above the metal-containing material layer so as to over-fill the trench/via with the sacrificial material, performing at least one process operation so as to remove portions of the metal-containing material layer and the sacrificial material layer positioned above an upper surface of the layer of insulating material and outside of the trench/via, removing the sacrificial material from within the trench/via so as to expose the metal-containing material layer positioned within the trench/via, selectively forming a material layer comprising a noble metal on the exposed metal-containing material without forming the material layer comprising a noble metal on the layer of insulating material, performing an anneal process so as to convert the metal-containing material layer into a metal-based silicate based barrier layer, and forming a conductive copper structure in at least the trench/via above the material layer comprising the noble metal.

Another illustrative method disclosed herein includes forming a metal-containing material layer in a trench/via that was formed in a layer of low-k (k value less than 3.3) insulating material, forming a sacrificial material layer above the metal-containing material layer so as to over-fill the trench/via with the sacrificial material, performing at least one chemical mechanical polishing process so as to remove portions of the metal-containing material layer and the sacrificial material layer positioned above an upper surface of the layer of low-k insulating material and outside of the trench/via, removing the sacrificial material from within the trench/via so as to expose the metal-containing material layer positioned within the trench/via, selectively forming a material layer comprising a noble metal on the exposed metal-containing material without forming the material layer comprising a noble metal on the layer of insulating material, performing an anneal process at a temperature that falls within the range of 100-400° C. so as to convert the metal-containing material layer into a metal-based silicate based barrier layer, and forming a conductive copper structure in at least the trench/via above the material layer comprising the noble metal.

BRIEF DESCRIPTION OF THE DRAWINGS

The disclosure may be understood by reference to the following description taken in conjunction with the accompanying drawings, in which like reference numerals identify like elements, and in which.

Figure 1A:
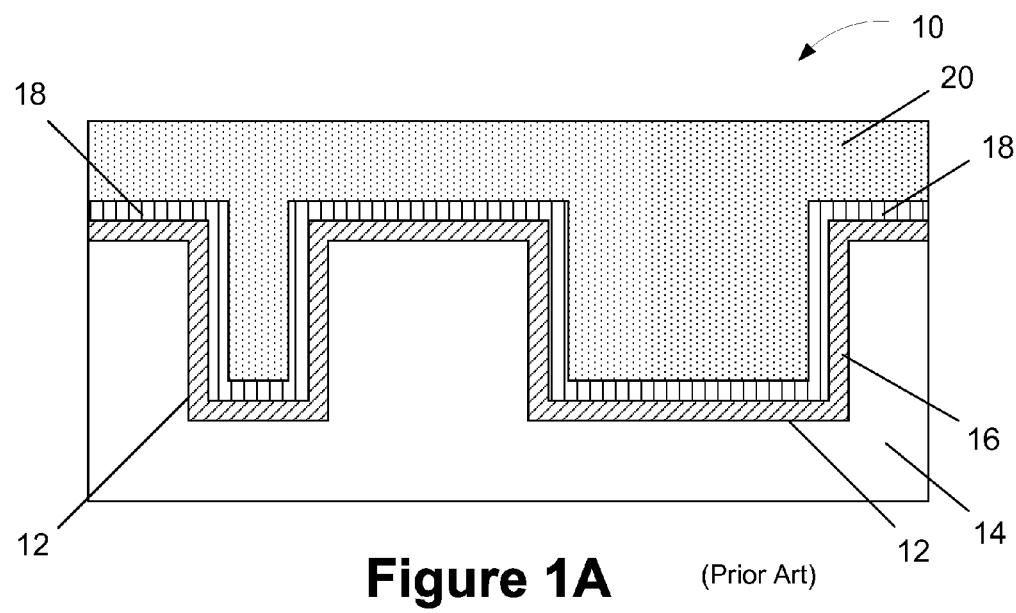
FIGS. 1A-1B depict an illustrative prior art method of forming conductive structures using a damascene process.
Figure 1B:
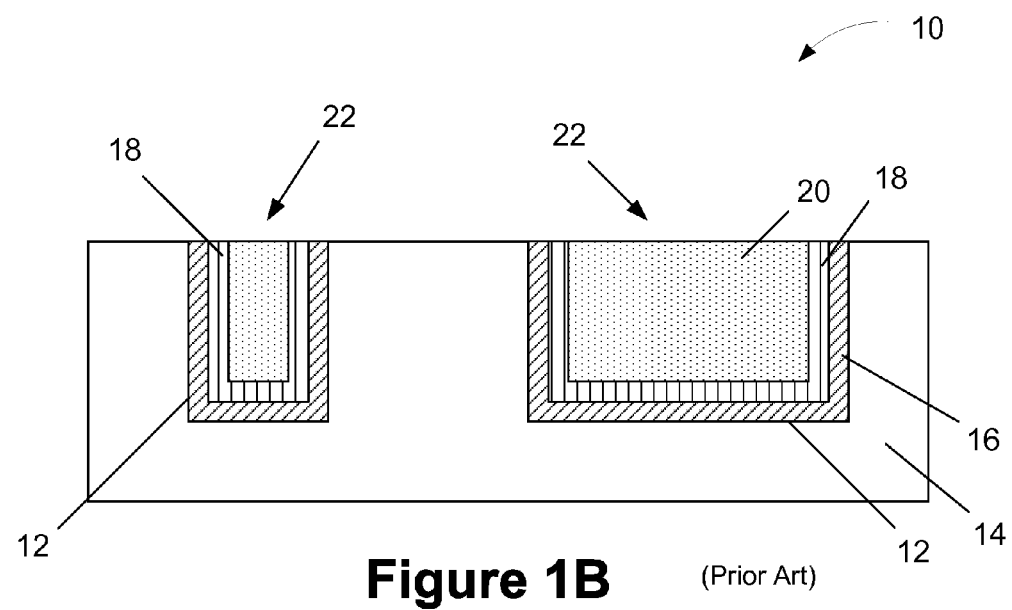

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of selectively forming ruthenium liner layers in connection with the formation of various conductive structures, such as conductive lines/vias. As will be readily apparent to those skilled in the art upon a complete reading of the present application, the present method is applicable to a variety of technologies, e.g., NFET, PFET, CMOS, etc., and is readily applicable to a variety of devices, including, but not limited to, ASIC's, logic devices, memory devices, etc. With reference to the attached drawings, various illustrative embodiments of the methods disclosed herein will now be described in more detail.

Figure 2A:
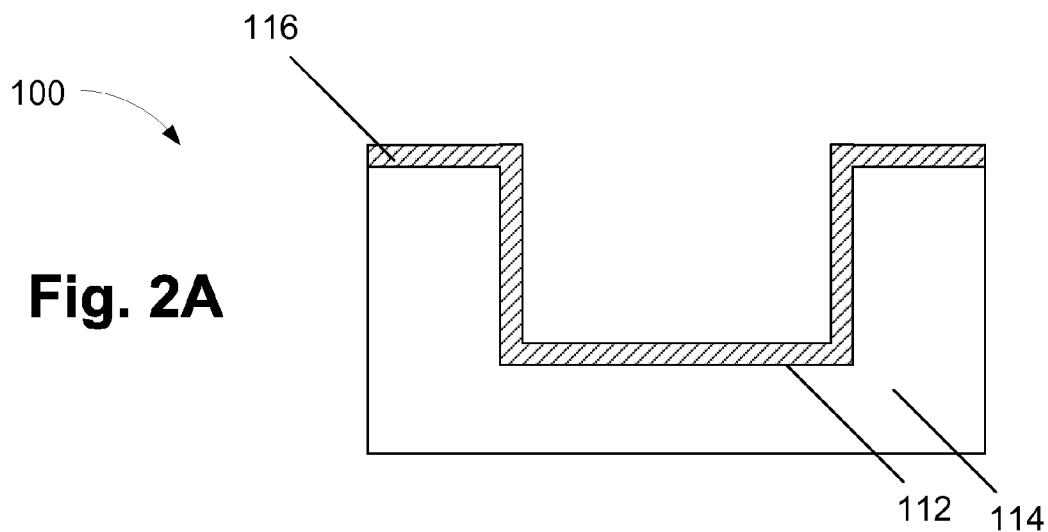
FIGS. 2A-2H depict various novel methods disclosed herein of selectively forming a ruthenium liner layer in connection with the formation of an illustrative conductive structure.

FIG. 2A is a simplified view of an illustrative integrated circuit product or device 100 at an early stage of manufacturing that is formed above a semiconductor substrate (not shown). The substrate may have a variety of configurations, such as a bulk substrate configuration, an SOI (silicon-on-insulator) configuration, and it may be made of materials other than silicon. Thus, the terms "substrate" or "semiconductor substrate" should be understood to cover all semiconducting materials and all forms of such materials. The device 100 may be any type of integrated circuit device that employs any type of a conductive structure, such as a conductive line or via, commonly found on integrated circuit devices.

At the point of fabrication depicted in FIG. 2A, a trench/via 112 has been formed in a layer of insulating material 114 by performing known photolithography and etching techniques through a patterned mask layer (not shown). The trench/via 112 is intended to be representative of any type of opening formed in any type of insulating material 114 wherein a conductive copper structure may be formed. The trench/via 112 may be of any desired shape, depth or configuration. For example, in some embodiments, the trench/via 112 is a classic trench that does not extend to an underlying layer of material, such as the illustrative trench 112 depicted in FIG. 2A. In other embodiments, the trench/via 112 may be a through-hole type feature, e.g., a classic via, that extends all of the way through the layer of insulating material 114 and exposes an underlying layer of material or an underlying conductive structure (not shown), such as an underlying metal line. Thus, the shape, size, depth or configuration of the trench/via 112 should not be considered to be a limitation of the present inventions. The trench/via 112 may be formed by performing any of a variety of different etching processes, e.g., a dry reactive ion etching process, through the patterned mask layer.

The various components and structures of the device 100 may be initially formed using a variety of different materials and by performing a variety of known techniques. For example, the layer of insulating material 114 may be comprised of any type of insulating material, e.g., a low-k insulating material (k value less than 3.3), etc., it may be formed to any desired thickness and it may be formed by performing, for example, a chemical vapor deposition (CVD) process or spin-on deposition (SOD) process, etc.

With continuing reference to FIG. 2A, a deposition process, e.g., a CVD or atomic layer deposition (ALD) process, is performed to form a layer of material 116 across the product 100 and in the trench/via 112. The layer of material 116 may be a metal-containing material, e.g., a metal, a pure metal, a metal alloy, a metal nitride, a metal oxide, etc. In one illustrative example, the layer of material 116 may be comprised of aluminum, aluminum oxide, manganese, manganese nitride or manganese oxide. The thickness of the layer of material 116 may vary depending upon the particular application, e.g., 0.5-3 nm.

Figure 2B:
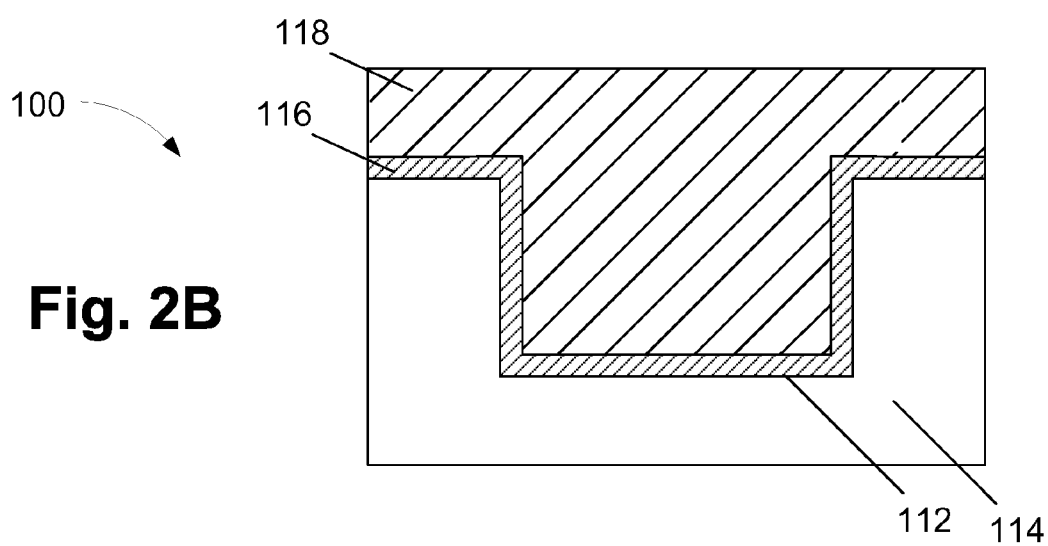

FIG. 2B depicts the device after a sacrificial material 118 has been formed above the layer of material 116 so as to over-fill the trench/via 112. In one embodiment, the sacrificial material 118 may be a material that is relatively easy to remove, e.g., OPL, etc. The sacrificial material 118 may be formed using any of a variety of known techniques depending upon the material selected for the sacrificial material 118, e.g., spin-coating/curing, deposition, etc.

Figure 2C:
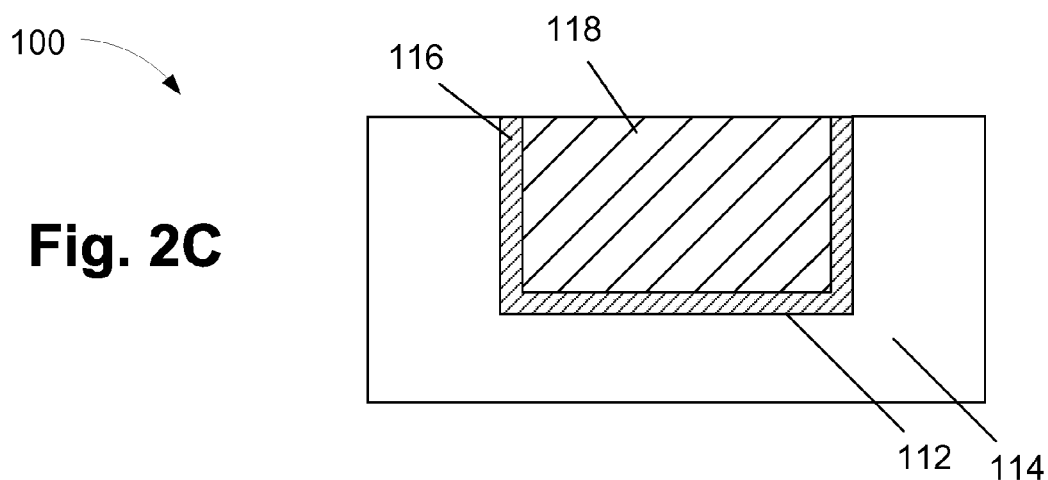

FIG. 2C depicts the product 100 after one or more CMP processes were performed to remove excess materials positioned above the surface of the layer of insulating material 114 and outside of the trench/via 112. These process operations result in the illustrative structure shown in FIG. 2C.

Figure 2D:
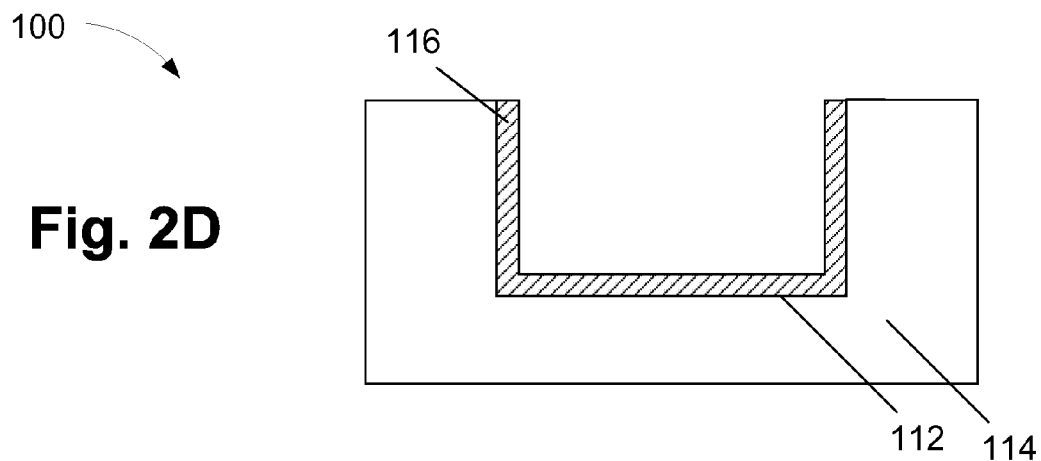

FIG. 2D depicts the device 100 after the residual portions of the sacrificial material 118 have been removed from the trench/via 112. A variety of techniques may be employed to remove the sacrificial material 118 depending upon the material used for the sacrificial material 118, e.g., a solvent based rinse, an etching process, etc.

Figure 2E:
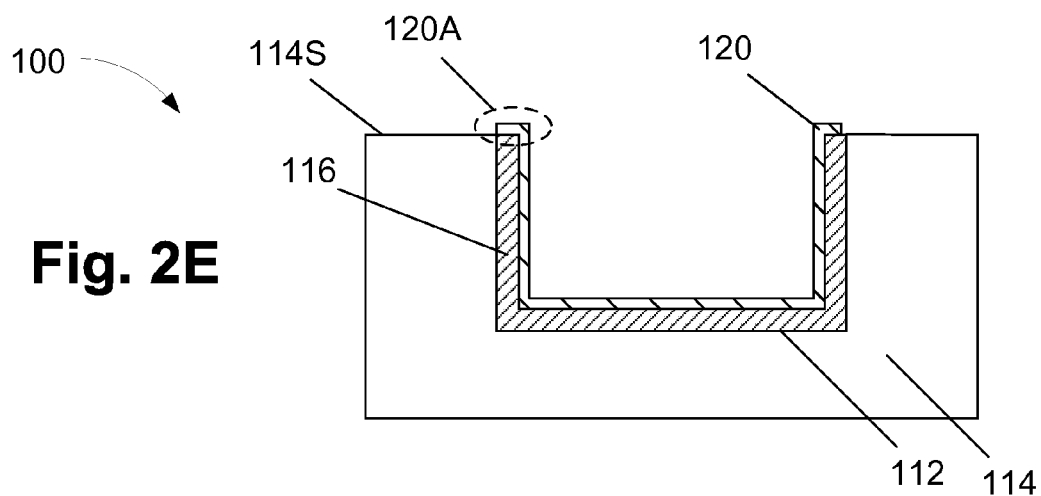

FIG. 2E depicts the device 100 after a selective deposition process, e.g., a selective ALD or CVD process, has been performed to selectively form a layer of material 120 comprised of a noble metal, e.g., ruthenium, etc., on the layer of material 116. In one illustrative example, the layer of material 120 may be formed by performing the selective deposition process set forth in U.S. Pat. No. 7,985,669, which is hereby incorporated by reference in its entirety. The thickness of the layer of material 120 may vary depending upon the particular application, e.g., 0.5-3 nm. Importantly, using the process described in the above-referenced patent, the layer of material 120 selectively forms on only the layer of material 116 and not on the upper surface 114S of the layer of insulating material 114. Note that, although the layer of material 120 is depicted as forming on top of the upper edge of the layer of material 116 in the region 120A, in practice, it may be the case that very little, if any, of the layer or material 120 actually forms on the upper edge of the layer of material 116. To the extent such material does form in the region 120A, it should be of such a small quantity that it may be subsequently removed, as described more fully below.

Figure 2F:
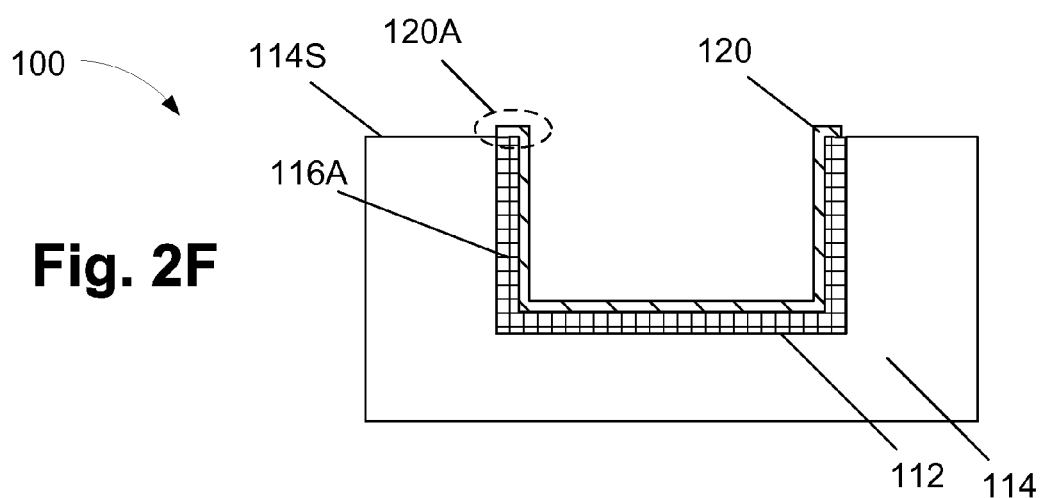

FIG. 2F depicts the product after an anneal process has been performed on the product 100. In one illustrative example, the anneal process may be performed in either a traditional furnace or an RTA chamber or in-situ in the degas chamber attached to the deposition platform used in forming the layer 120. The anneal process may be performed at a temperature that falls within the range of about 100-400° C. for a duration of about 1-60 minutes. The anneal process serves several purposes. First, it converts the layer of material 116 into a metal-based silicate material barrier layer 116A, such as a metal silicate material like manganese-silicate or aluminum-silicate. This change in nature of the layer of material 116 is reflected by the use of the new reference number—116A—and the use of different cross-hatching on the metal-based silicate material barrier layer 116A. As its name indicates, the metal-based silicate material barrier layer 116A serves as a barrier layer for a conductive copper structure that will subsequently be formed on the trench/via 112. Second, the anneal process improves the quality of the layer of material 120, e.g., a larger grain size and/or smoother morphology.

Figure 2G:
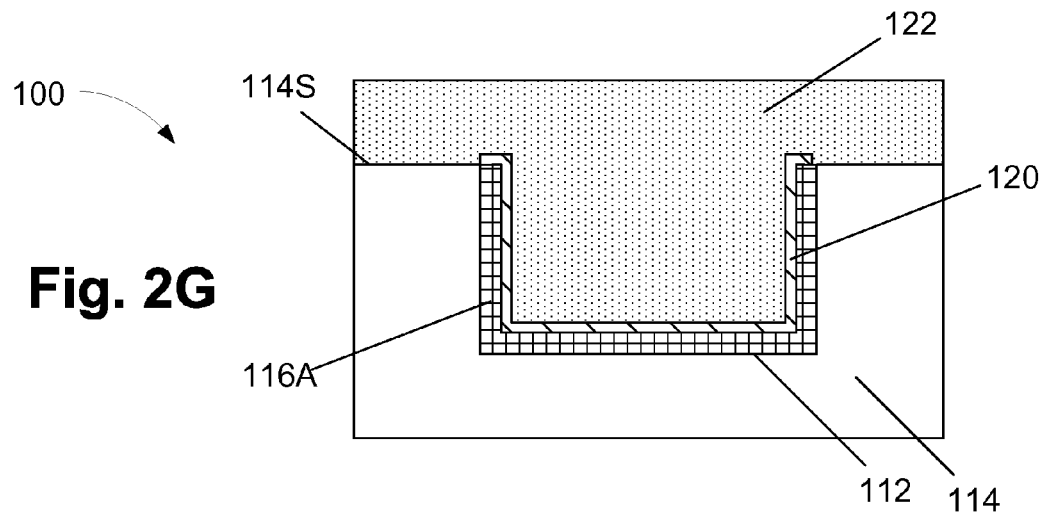

FIG. 2G depicts the product after a copper-based seed layer (not shown) was formed above the layer of material 120 and after a bulk deposition process to overfill the opening with bulk copper 122 that was formed by performing any of a variety of known electroplating or an electroless deposition processes.

Figure 2H:
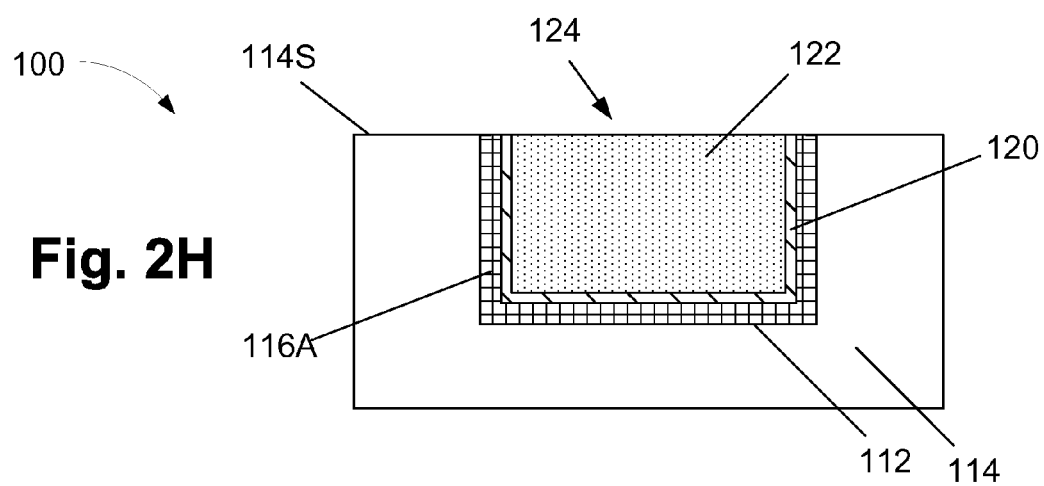

Thereafter, as shown in FIG. 2H, one or more CMP processes were performed to remove excess materials positioned above the surface 114S of the layer of insulating material 114 and outside of the trench/via 112. These process operations result in the illustrative conductive copper structure 124 shown in FIG. 2H.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a trench/via in a layer insulating material;
forming a metal-containing material layer in said trench/via;
forming a sacrificial material layer above said metal-containing material layer so as to over-fill said trench/via with said sacrificial material;
performing at least one process operation so as to remove portions of said metal-containing material layer and said sacrificial material layer positioned above an upper surface of said layer of insulating material and outside of said trench/via;
removing said sacrificial material from within said trench/via so as to expose said metal-containing material layer positioned within said trench/via;
selectively forming a material layer comprising a noble metal on said exposed metal-containing material layer positioned within said trench/via without forming said material layer comprising a noble metal on said layer of insulating material;
performing an anneal process so as to convert said metal-containing material layer positioned within said trench/via into a metal-based silicate barrier layer; and
forming a conductive copper structure in at least said trench/via above said material layer comprising said noble metal.

2. The method of claim 1, wherein said layer of insulating material is comprised of a low-k insulating material having a k value less than 3.3.

3. The method of claim 1, wherein performing said at least one process operation comprises performing at least one chemical mechanical polishing process.

4. The method of claim 1, wherein said sacrificial material layer is comprised of OPL.

5. The method of claim 1, wherein said material layer comprising said noble metal is comprised of manganese, manganese nitride, manganese oxide, aluminum or aluminum oxide.

6. The method of claim 5, wherein said material layer comprising said noble metal has a thickness that falls within the range of 0.5-3 nm.

7. The method of claim 1, wherein said anneal process is performed at a temperature that falls within the range of 100-400° C.

8. The method of claim 1, wherein said metal-based silicate barrier layer is comprised of one of manganese-silicate or aluminum-silicate.

9. The method of claim 1, wherein said material layer comprising said noble metal is a layer of ruthenium.

10. A method, comprising:
forming a trench/via in a layer of low-k (k value less than 3.3) insulating material;
forming a metal-containing material layer in said trench/via;
forming a sacrificial material layer above said metal-containing material layer so as to over-fill said trench/via with said sacrificial material;
performing at least one chemical mechanical polishing process so as to remove portions of said metal-containing material layer and said sacrificial material layer positioned above an upper surface of said layer of low-k insulating material and outside of said trench/via;
removing said sacrificial material from within said trench/via so as to expose said metal-containing material layer positioned within said trench/via;
selectively forming a material layer comprising a noble metal on said exposed metal-containing material layer positioned within said trench/via without forming said material layer comprising a noble metal on said layer of low-k insulating material;
performing an anneal process so as to convert said metal-containing material layer positioned within said trench/via into a metal-based silicate barrier layer, wherein said anneal process is performed at a temperature that falls within the range of 100-400° C.; and
forming a conductive copper structure in at least said trench/via above said material layer comprising said noble metal.

11. The method of claim 10, wherein said sacrificial material layer is comprised of OPL.

12. The method of claim 10, wherein said material layer comprising said noble metal is comprised of manganese, manganese nitride, manganese oxide, aluminum or aluminum oxide.

13. The method of claim 10, wherein said material layer comprising said noble metal has a thickness that falls within the range of 0.5-3 nm.

14. The method of claim 10, wherein said metal-based silicate barrier layer is comprised of one of manganese-silicate or aluminum-silicate.

15. The method of claim 10, wherein said material layer comprising said noble metal is a layer of ruthenium.

16. A method, comprising:
forming a trench/via in a layer of low-k (k value less than 3.3) insulating material;
forming a metal-containing material layer in said trench/via, wherein said metal-containing material layer is comprised of one of manganese, manganese nitride, manganese oxide, aluminum or aluminum oxide;
forming a sacrificial material layer above said metal-containing material layer so as to over-fill said trench/via with said sacrificial material;
performing at least one chemical mechanical polishing process so as to remove portions of said metal-containing material layer and said sacrificial material layer positioned above an upper surface of said layer of low-k insulating material and outside of said trench/via;
removing said sacrificial material from within said trench/via so as to expose said metal-containing material layer positioned within said trench/via;
selectively forming a layer of ruthenium on said exposed metal-containing material layer positioned within said trench/via without forming said layer of ruthenium on said layer of low-k insulating material;
performing an anneal process so as to convert said metal-containing material layer positioned within said trench/via into a metal-based silicate barrier layer comprised of one of manganese-silicate or aluminum-silicate, wherein said anneal process is performed at a temperature that falls within the range of 100-400° C.; and forming a conductive copper structure in at least said trench/via above said layer of ruthenium.

17. The method of claim 16, wherein said sacrificial material layer is comprised of OPL.

18. The method of claim 16, wherein said layer of ruthenium has a thickness that falls within the range of 0.5-3 nm.

* * * * *